United States Patent [19]
Schwarz et al.

[11] Patent Number: 5,273,957
[45] Date of Patent: Dec. 28, 1993

[54] THERMALLY SPRAYED LEAD-CONTAINING THICK LAYERS

[75] Inventors: Martin Schwarz, Frankfurt am Main; Eugen Morach, Liederbach; Hubert Schindler, Liederbach; Sabine Jünger, Liederbach, all of Fed. Rep. of Germany

[73] Assignee: Hoechst Aktiengesellschaft, Frankfurt am Main, Fed. Rep. of Germany

[21] Appl. No.: 801,456

[22] Filed: Dec. 2, 1991

[30] Foreign Application Priority Data

Dec. 4, 1990 [DE] Fed. Rep. of Germany ....... 4038564

[51] Int. Cl.$^5$ ........................... B05D 1/08; B05D 5/12
[52] U.S. Cl. ...................... 505/1; 505/730; 505/742; 427/62; 427/446; 427/453
[58] Field of Search ........................... 505/1, 730, 742; 427/62, 63, 34, 423, 446, 453

[56] References Cited

U.S. PATENT DOCUMENTS 4,687,678  8/1987  Lindblom ..................... 427/34

FOREIGN PATENT DOCUMENTS 0324121  7/1989  European Pat. Off. .
0326944  8/1989  European Pat. Off. .
0327044  8/1989  European Pat. Off. .
1-224206  9/1989  Japan .

OTHER PUBLICATIONS

Fukushima et al, "Structural modulation and superconducting properties in $Bi_{2-x}Pb_xSr_2CaCu_2O_{8+d}$ and $Bi_{2-y}Pb_ySr_2YCu_2O_{8+d}$", Physica C 159 (1989) pp. 777–783.

Yoshida et al, "High-Tc Superconducting Films of Bi–Pb–Sr–Ca–Cu–O oxide prepared by plasma spraying", Jpn. J. Appl. Phys. 28(4) Apr. 1989 pp. L639–L642.

Karthikeyan et al, "Plasma sprayed superconducting $YiBa_2Cu_3O_{7-x}$ coatings" J. Phys. D:Appl. Phys. 21(1988) pp. 1246–1249.

Sankawa et al, "Superconductivity in $YBa_2Cu_3O_{7-\delta}$ thick films by the atmospheric plasma powder spray-
(List continued on next page.)

*Primary Examiner*—Roy King
*Attorney, Agent, or Firm*—Curtis, Morris & Safford

[57] ABSTRACT

A process is described for producing a superconducting thick layer on a base material by thermally spraying a powder containing bismuth, lead, strontium, calcium and copper in oxidic form. First a powdered starting mixture is prepared which has a composition corresponding to the formula:

$$Bi_{1.90-x}Pb_xSr_{2-y}Ca_{2.2-z}Cu_{3.5-q}O_v$$

in which $0.1 \leq x \leq 0.7$, $0 \leq y \leq 0.4$, $-0.5 \leq z \leq +0.5$, $0 \leq q \leq 1.2$ and v is the oxygen content calculated from the starting materials. Then the powder is heated for not less than 1 hour at a temperature of not less than 750° C. in an oxygen-containing atmosphere and cooled again. The powder pre-reacted in this way is applied to a thermally stable substrate in a layer thickness of 0.5 to 7 mm by means of a burner by plasma-jet spraying or by flame spraying. The layer applied is then sintered for a time of not less than 40 hours at a temperature of 842° to 848° C. The layer is cooled to a temperature of 550° to 650° C. after sintering, held at this temperature for not less than 20 minutes, reheated to the sintering temperature and again held for not less than 20 minutes at this temperature. This procedure is repeated not less than twice and then the layer is cooled.

10 Claims, 1 Drawing Sheet

OTHER PUBLICATIONS ing", Jpn. J. Appl. Phys. 27(6) Jun. 1988 pp. L1083–L1085.

Ohmori et al, "Formation of yttrium–barium–copper–oxygen system superconductor by thermal spraying", Trans. JWRI 20(1) 1991 pp. 53–60.

JA-A-2 125 854 (Kagaku Gijutsu-Cho Kinz), May 14, 1990.

Journal of American Ceramic Society, Bd. 73, No. 4, Apr. 1990, Columbus, US; pp. 889–892, F. -H. Chen et al., "Formation of High-$T_c$ Superconducting Bi–Pb–Sr–Ca–Cu oxide films by spray pyrolysis of an oxalate suspension".

Chemical Abstracts, Band 111, 1989, Columbus, Ohio, US; Zussamenfassung Nr. 204412F, T. Arima et al., "Optical spectra of bismuth lead strontium calcium copper oxide", p. 644.

THERMALLY SPRAYED LEAD-CONTAINING THICK LAYERS

DESCRIPTION

The present invention relates to compact, superconducting layers composed of a bismuth- and lead-containing ceramic high-temperature superconductor, and to a process for its production by means of plasma-jet spraying or flame spraying.

Conventional metallic superconductors are notable for low critical temperatures $T_c$ which make the use of the expensive coolant helium necessary. The new high-temperature superconducting materials with an oxide ceramic base have critical temperatures which are in principle achievable even with liquid nitrogen as coolant.

Thick layers, that is to say layers having a thickness of about 0.2 to 10 mm, composed of high-temperature superconducting (=HTSC) materials can be produced rapidly and in compact form by thermal spraying. A disadvantage of this process is that the oxide ceramic HTSC material fed in partially fuses because of the high spraying temperatures and loses large amounts of oxygen and also loses its superconducting properties completely or partially. For small layer thicknesses, the missing oxygen can be reintroduced into the material by a thermal aftertreatment.

In the thermal aftertreatment, the sprayed layer is heated in an oxygen atmosphere to a temperature at which the oxygen is absorbed and then slowly cooled in an oxygen atmosphere. In this process, the thermal aftertreatment may consist of a plurality of heating and cooling steps. It is time-consuming and cost-intensive. In addition, the thermal aftertreatment may result in undesirable impurities in the sprayed layer if substances diffuse out of the base material into the sprayed layer or chemically react with the sprayed layer.

The object was therefore to produce superconducting thick layers having as high critical temperatures as possible and a high superconducting component by volume (measured at $T=77K$, the boiling point of $N_2$).

Surprisingly, it has been found that a powder of the overall composition $Bi_2Sr_2Ca_2Cu_3O_{12-x}$ is well suited as starting material for a thermal spraying process because the critical temperature of the layer applied and then tempered is approximately 110K, i.e. markedly above the boiling point of liquid $N_2$. The production of a starting material suitable for spraying is described in EP-A-327 044. For example, 4.3 mol of $Bi_2O_3$, 7 mol of $SrCO_3$, 7 mol of $CaCO_3$ and 12 mol of CuO are comminuted in an agate mortar, mixed and transferred to an $Al_2O_3$ crucible. The product is heated in air to 800°-820° C., held there for 20 hours, rapidly cooled to room temperature and comminuted in the mortar.

The thermal spraying of such a material is described in DE-A-39 27 168.

A process has now been found for producing a superconducting thick layer on a base material by thermally spraying a starting mixture containing Ca, Sr, Bi and Cu, and additionally Pb, in oxidic form, which process comprises preparing a powdered starting mixture which has a composition corresponding to the formula $Bi_{1.90-x}Pb_xSr_{2-y}Ca_{2.2-z}Cu_{3.5-q}O_v$, in which x is between 0.1 and 0.7, y is between 0 and 0.4, z is between $-0.5$ and $+0.5$, q is between 0 and 1.2 and v is the oxygen content calculated from the starting materials, heating the powder for a time of not less than 1 hour at a temperature of not less than 750° C. in an oxygen-containing atmosphere and cooling again, applying the powder pre-reacted in this way to a thermally stable substrate in a layer thickness of 0.1 to 10 mm, in particular 0.2 to 10 mm, preferably 0.5 to 7 mm, by means of a burner by plasma-jet spraying or flame spraying, sintering the layer for a time of not less than 40 hours at a temperature of 842° to 848° C., in which process the layer must not melt, cooling the layer to a temperature of 550° to 650° C. after sintering, holding it at this temperature for not less than 20 minutes and reheating it to the sintering temperature of 842° to 848° C., the layer being held at this temperature for not less than 20 minutes in each case, repeating this procedure not less than twice and then cooling the layer.

The starting mixture may contain the said metals as oxides or oxide precursors, for example as carbonates, nitrates or oxalates.

Suitable materials for the thermally resistant substrate are, in particular, the metals copper or silver, magnesium oxide, strontium titanate or strontium indate.

In general, the layer applied by plasma-jet spraying or flame spraying adheres firmly to the substrate. However, with a suitable shape and type of substrate, it is possible to peel it off. In this case, the pure layer, i.e. without substrate, can be subjected to further thermal treatment, in which case a compact superconducting layer without substrate is obtained.

In particular, the molding surface should be composed of a material which does not react with the oxide ceramic material and this material should have a thermal coefficient of expansion which is different from the thermal coefficient of expansion of the oxide ceramic material sprayed on. When the molding surface is cooled during the coating and the finally coated molding surface is quenched, the coating can be peeled off as a molded body from the molding surface. This process is described in the German Patent Application P 39 23 008.2, to which reference is expressly made here.

For the purpose of pre-reaction, the powdered starting mixture can in principle be heated (in an oxygen-containing atmosphere) to such an extent that melting occurs. Then the melt has to be pulverized again after cooling. It is better, however, to heat the powdered starting material (in an oxygen-containing atmosphere) for the purpose of pre-reaction to a temperature at which no melting occurs. The heating lasts advantageously for not less than 5 hours. Air can be satisfactorily used as an oxygen-containing atmosphere.

In order to keep the oxygen loss low during thermal spraying, it is advantageous to feed oxygen, dinitrogen oxide or ozone additionally into the heating flame of the burner and/or into the spraying jet.

In this development of the process according to the invention, the oxygen enrichment of the sprayed layer is achieved simply, more rapidly and more uniformly over the cross section of the superconducting layer than in the case of conventional thermal spraying without additionally feeding in oxygen, dinitrogen oxide or ozone and with subsequent thermal aftertreatment. The dinitrogen oxide decomposes under the thermal spraying conditions to form atomic, highly reactive oxygen and nitrogen oxides.

Of the thermal spraying processes, in the process according to the invention, flame spraying and plasma-jet spraying are used in particular, with the variants cited in DIN 32 530 ("Deutsche Industrie Norm" or German Standard Method 32530). In flame spraying, the powdered material is incipiently or completely melted in a fuel gas/oxygen flame and propelled onto the base material by the expanding combustion gas alone or with simultaneous assistance by an atomizing gas (for example compressed air). Oxygen is fed into the fuel gas in an amount adequate for burning the fuel gas. With acetylene as fuel gas, a temperature of not more than 3150° C. is reached. Substantially higher temperatures of up to 20,000° C. can be achieved in plasma-jet spraying. In plasma-jet spraying, the powdered material is incipiently or completely melted inside or outside the burner by a plasma flame, accelerated and propelled onto the base material. The plasma is produced by an electric arc which is struck between cathode and anode. Plasma gases used are, for example, argon, helium, nitrogen or mixtures thereof. The electrically neutral plasma jet leaves the plasma burner at high velocity and temperature.

The oxide ceramic material is fed into the heating flame in powdered form inside or preferably outside the burner by means of a carrier gas. The powdered material is melted by the high temperature of the heating flame or incipiently melted at the surface of the powder particles. The incipiently or completely melted material is sprayed as a spray jet onto a base material on which it deposits as a sprayed layer. During thermal spraying, the oxide ceramic material loses oxygen, which results in the loss or an impairment of the superconducting properties. As a result of the process according to the invention, the oxide ceramic material is either enriched with oxygen after application as a layer by sintering and resintering or the material is enriched again with oxygen in the spray jet before it strikes the base material, so that a sprayed layer with good superconducting properties is immediately obtained.

The additional oxygen, the dinitrogen oxide or the ozone is preferably fed to the heating flame and/or the spray jet outside the burner, in particular at the burner outlet. Air enriched with oxygen can be used; preferably, however, pure oxygen is fed in. If the powdered material is conveyed into the heating flame outside the burner, the oxygen, the dinitrogen oxide or the ozone can be fed in at the same point as the powdered material. It is, however, also possible to provide the feeding-in of oxygen, dinitrogen oxide or ozone into the spray jet only subsequently.

Preferably, a plurality of feed lines or nozzles are disposed around the heating flame or the spray jet. The feeding-in is preferably carried out by means of a ring nozzle disposed around the heating flame or spray jet in order to feed oxygen, dinitrogen oxide or ozone into the oxide ceramic material uniformly from all sides. The feed lines or nozzles are preferably so disposed that the oxygen, the dinitrogen oxide or the ozone is fed in perpendicularly to the flow direction of the spray jet. In another preferred embodiment, oxygen, dinitrogen oxide or ozone is fed in a flow forming an acute angle with the flow direction of the spray jet. In order to envelop the heating flame and the spray jet with the oxygen, dinitrogen oxide or ozone fed in, a funnel-shaped attachment may be disposed around the heating flame and/or the spray jet after the discharge of the oxygen, dinitrogen oxide or ozone from the feed line(s) or nozzle(s). For example, a funnel-shaped attachment can be screwed onto the ring nozzle. As a result heating flame and spray jet are enveloped by the oxygen, dinitrogen oxide or the ozone. The oxygen, the dinitrogen oxide or the ozone may also be fed in together with the powdered oxide ceramic material by adding the oxygen, the dinitrogen oxide or the ozone to the carrier gas with which the material is conveyed into the heating flame of the burner. It is also possible to use oxygen alone as carrier gas.

Particularly oxygen-rich sprayed layers, i.e. particularly good superconducting properties, are obtained if the spraying distance between burner and base material is increased. However, an unduly large distance cannot be chosen because of the spraying loss which increases with increasing distance. As large a spraying distance as possible is therefore chosen within the range of the spraying distances normally used.

This variant of chemical spraying is described in greater detail with reference to the drawing. In the drawing:

BRIEF DESCRIPTION OF THE DRAWINGS

Centrally arranged inside the plasma burner 1 is a rod-type cathode 2. At the burner outlet there is an annular anode 3. At the cathode 2 and the anode 3, cooling water channels 4 are provided. Between cathode 2 and anode 3, an electric arc of high energy density is struck. It gives up the majority of its thermal energy to the plasma gas 5, which is consequently partially ionized. Diatomic gases first dissociate and give up the absorbed thermal energy again outside the plasma burner 1. The oxide ceramic material is blown into the plasma flame 6 emerging from the burner at high velocity through a powder feed 7 at the burner outlet. The material is incipiently or completely melted by the high temperature of the plasma flame 6 and is propelled with the plasma gas as spray jet 8 onto the base material 9, where it deposits as sprayed layer 10. The arrow indicates the direction of advance of the base material 10. In FIG. 1, there is disposed, viewed in the spraying direction, behind the powder feed 7 a ring nozzle 11 into which oxygen is fed through the line 12. The nozzle opening 13 is directed towards the base material so that the oxygen is fed into the spray jet 8 and the plasma flame tip in a flow forming an acute angle with the flow direction of the spray jet 8. Adjoining the burner outlet is a funnel-shaped attachment 14 which is disposed around the spray jet 8.

In the embodiment of FIG. 2, the powder feed 7 and the oxygen feed are disposed at the same level at the burner outlet. The oxygen is fed in through three lines 12. Said lines 12 and also the powder feed 7 are each disposed in the same plane perpendicularly to the spraying direction and rotated through 90° with respect to each other (cf. FIG. 3). In this embodiment, the oxygen is fed through the nozzles 13 into the plasma flame in a flow which is in all cases directed perpendicularly to the flow direction of the spray jet.

As mentioned above, the sintered layer should first be cooled, then reheated to the sintering temperature of 842° to 848° C. and held at this temperature for not less than 20 minutes. It has proved advantageous if resintering is carried out at this temperature for a total of 10 to 40 hours. Total resintering times of 15 to 36 hours are preferred. For as comprehensive an oxygen absorption as possible, it is furthermore advantageous to carry out the repeated heating from 550° to 650° C. to the sintering temperature of 842° to 848° C. in an oxygen-containing atmosphere.

It has been found that it is advantageous to cool the specimens at the end of the thermal aftertreatment slowly from the sintering temperature to room temperature, in particular at a rate of not more than 100K/h. It is advantageous if the Ca:Sr atomic ratio is 1:1.

It is advantageous to carry out the thermal spraying and the sintering at 842° to 848° C. in an oxygen-containing atmosphere, in particular in air. A reducing atmosphere yields significantly poorer results.

In the repeated heating from 550° to 650° C. to the sintering temperature and recooling, the best results are obtained with T=600° C. as the lower temperature value.

It is possible to produce compact superconducting layers having a thickness of 0.1 to 10 mm, in particular 0.2 to 10 mm, preferably 0.5 to 7 mm, and a critical temperature of 105K by the process according to the invention. Their overall composition corresponds to the starting oxide mixture. The phase component, determined by X-ray diffraction, of crystalline $Bi_2Sr_2Ca_2Cu_3O_y$ is not less than 30% by volume. This component may rise to virtually 100% by volume. It falls to approx. 5% if the repeated cooling to 550-650 and heating to 842°-848° C. is omitted. These layers are initially firmly joined to a heat-resistant substrate on which they have been deposited. They can, however, also be produced in isolation. The proportion by volume determined by the Meissner effect at T=90K and H=15 gauss is not less than 50%. The critical temperature $T_c$ is about 105-110K.

The invention is explained in greater detail by the examples.

EXAMPLE 1

A layer containing the oxides of Bi, Pb, Sr, Ca and Cu in the atomic ratios 8:2:8:10:14 was sintered for 7 days at 846° C. in air. It was then cooled eight times to 600° C. each time and reheated (in air) to 846° C. The specimen was removed from the furnace at 600° C.

Result:

According to resistance measurement and SQUID measurement, the critical temperature is about 105K. The superconducting components make up 50% by volume (measured at 77K and 15 gauss by the Meissner effect). According to the X-ray diffraction pattern, the $Bi_2Sr_2Ca_2Cu_3O_y$ phase component is 98% by volume.

EXAMPLE 2 (ENRICHMENT OF THE SPRAY JET WITH $O_2$)

Figure 1:
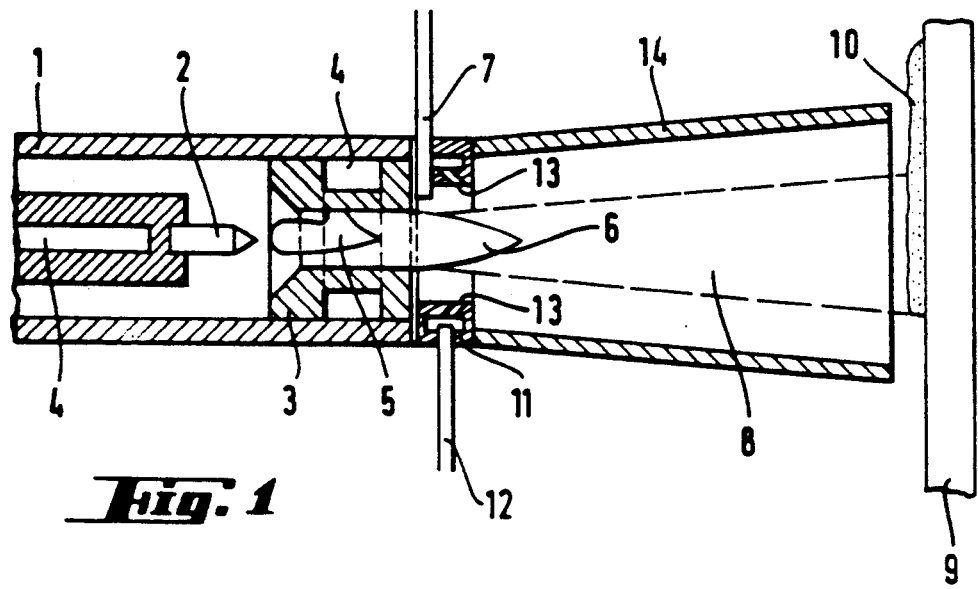
FIG. 1 shows a diagrammatic cross section through a first embodiment of a plasma burner and the path of the incipiently or completely melted material until it strikes the base material.
Figure 2:
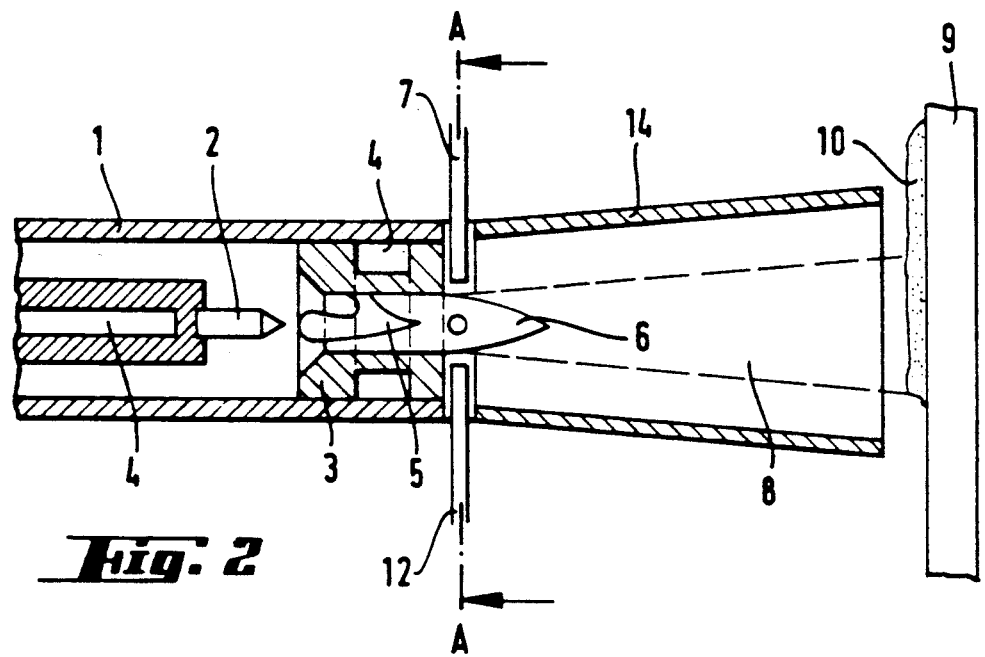
FIG. 2 shows a diagrammatic cross section through a second embodiment of a plasma burner.
Figure 3:
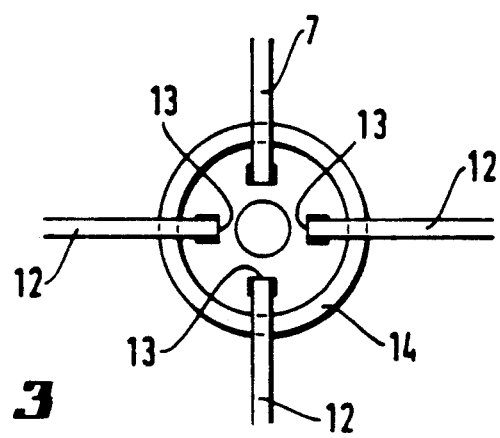
FIG. 3 shows a section along the line A—A through the plasma burner of FIG. 2.

Superconducting $Bi_{1.8}Pb_{0.2}Sr_2CaCu_2O_{10-x}$ powder (particle size less than 100 μm) was introduced into a plasma jet system in which there were disposed around the spray jet three oxygen nozzles through which pure oxygen was fed in excess perpendicular to the flow direction of the spray jet (cf. FIGS. 2 and 3). The incipiently or completely melted material was sprayed onto a base plate composed of MgO using a spraying distance of 130 mm. The sprayed layer formed had a composition determined by elemental analysis of $Bi_{1.8}Pb_{0.2}Sr_2CaCu_2O_{8.4}$ and a critical temperature $T_c=84K$ (AC susceptibility measurement).

We claim:

1. A process for producing a superconducting layer of 0.5 to 7 mm thickness by thermally spraying a powder containing bismuth, lead, strontium, calcium and copper in oxidic form, which comprises preparing a powdered starting mixture with a composition of $Bi_{0.8}Pb_{0.2}Sr_{0.8}Ca_1Cu_{1.4}$ in oxidic form having an oxygen content calculated from said starting mixture, heating the powder for a time of not less than 1 hour at a temperature of not less than 750° C. in an oxygen-containing atmosphere and cooling again, applying the powder pre-reacted in this way to a thermally stable substrate in a layer thickness of 0.5 to 7 mm by means of a burner by plasma-jet spraying or flame spraying, sintering the layer for a time of not less than 40 hours at a temperature of 842° to 848° C., in which process the layer must not melt, cooling the layer to a temperature of 550° to 650° C. after sintering, holding it at this temperature for not less than 20 minutes and reheating it to the sintering temperature of 842° to 848° C., the layer being held at this temperature for not less than 20 minutes in each case, repeating this procedure not less than twice and then cooling the layer.

2. The process as claimed in claim 1, wherein the powdered starting mixture is heated to a temperature at which melting does not occur.

3. The process as claimed in claim 1, wherein the powdered starting mixture is heated until it melts and the melt is pulverized again after cooling.

4. The process as claimed in claim 1, wherein total resintering times of 10 to 40 hours are maintained during repeated heating to a sintering temperature of 842° to 848° C.

5. The process as claimed in claim 4, the total resintering times are 15 to 36 hours.

6. The process as claimed in claim 1, wherein the repeated heating to the sintering temperature and holding at the sintering temperature are carried out in an oxygen-containing atmosphere.

7. The process as claimed in claim 1, wherein the final cooling is carried out from the sintering temperature to room temperature at a rate of not more than 100 K/h.

8. The process as claimed in claim 1, wherein the starting powder is heated and cooled again in an oxygen-containing atmosphere up to 4 times.

9. A process for producing a superconducting layer of 0.5 to 7 mm thickness on a base material without the need of post-annealing by thermally spraying a powder containing bismuth, lead, strontium calcium and copper in oxidic form, which comprises preparing a powdered superconducting starting mixture which has a composition represented by the formula $Bi_{1.8}Pb_{0.2}Sr_2CaCu_2O_{10-x}$ in which $0.1 \leq X \leq 0.7$, heating the powder for a time of not less than 1 hour at a temperature of not less than 750° C. in an oxygen-containing atmosphere and cooling again, applying the powder treated in this way to a thermally stable substrate in a layer thickness of 0.5 to 7 mm by means of a burner by plasma-jet spraying or by flame spraying, and additionally feeding to the plasma jet or to the heating flame of the burner, but perpendicular to the flow direction of the spray jet, an oxidizing agent selected from the group consisting of oxygen, dinitrogen oxide and ozone.

10. The process as claimed in claim 9, wherein oxygen, dinitrogen oxide or ozone are fed in an amount which is a stoichiometric excess of the amount to maintain the oxygen content of the composition.

* * * * *